US006972943B2

(12) United States Patent
Kato et al.

(10) Patent No.: US 6,972,943 B2
(45) Date of Patent: Dec. 6, 2005

(54) ELECTRONIC COMPONENT HAVING LEAD FRAME

(75) Inventors: Kazuhiro Kato, Higashiosaka (JP); Masaaki Kido, Hirakata (JP); Yasuko Suma, Osaka (JP)

(73) Assignees: Sanyo Electric Co., Ltd., Moriguchi (JP); Sanyo Electronic Components Co., Ltd., Daito (JP)

( * ) Notice: Subject to any disclaimer, the term of this patent is extended or adjusted under 35 U.S.C. 154(b) by 0 days.

(21) Appl. No.: 10/725,576

(22) Filed: Dec. 3, 2003

(65) Prior Publication Data

US 2004/0113242 A1 Jun. 17, 2004

(30) Foreign Application Priority Data

Dec. 12, 2002 (JP) ............................ 2002-360064
Aug. 28, 2003 (JP) ............................ 2003-305365

(51) Int. Cl.[7] ......................... H01G 4/228; H01G 9/04; H01G 4/232
(52) U.S. Cl. .................... 361/533; 361/531; 361/308.2
(58) Field of Search .......................... 361/306.1, 306.2, 361/306.3, 307, 308.1, 308.2, 308.3, 309–310, 361/531, 533, 537–538, 540

(56) References Cited

U.S. PATENT DOCUMENTS 6,046,902 A * 4/2000 Nakagawa et al. ...... 361/306.1
6,188,566 B1 * 2/2001 Aoyama ..................... 361/534
6,451,622 B1 * 9/2002 Sawai ......................... 438/65
6,473,291 B1 * 10/2002 Stevenson ................ 361/306.3
6,751,086 B2 * 6/2004 Matsumoto ................. 361/523
6,813,141 B2 * 11/2004 Kuroyanagi ................ 361/533

FOREIGN PATENT DOCUMENTS

JP 8-148392 6/1996
WO WO 00/55875 * 9/2000 .......... H01G 4/248

* cited by examiner

*Primary Examiner*—Eric W. Thomas
(74) *Attorney, Agent, or Firm*—Armstrong, Kratz, Quintos, Hanson & Brooks, LLP

(57) ABSTRACT

An electronic component has a lead frame attached to an element with a conductive adhesive. The lead frame has one of a hole, cavity, cutout and groove filled with the adhesive. The lead frame may be provided with a plurality of grooves intersecting one another and divided into frame segments by the grooves.

3 Claims, 4 Drawing Sheets

F I G. 1
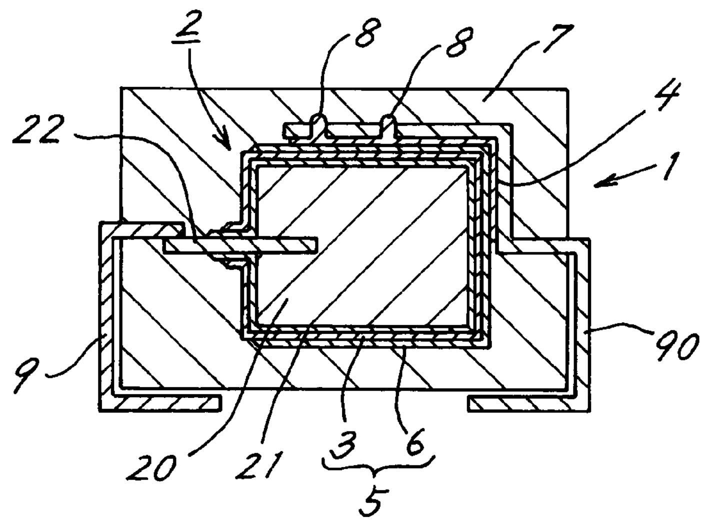
F I G. 2
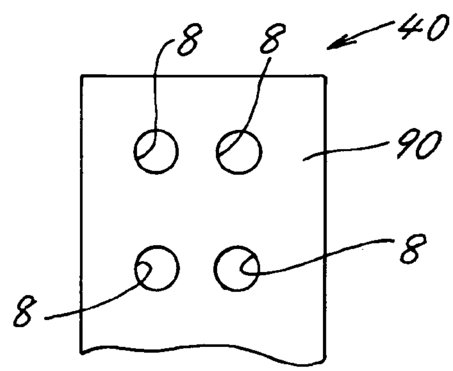
F I G. 3(a) F I G. 3(b) F I G. 3(c)
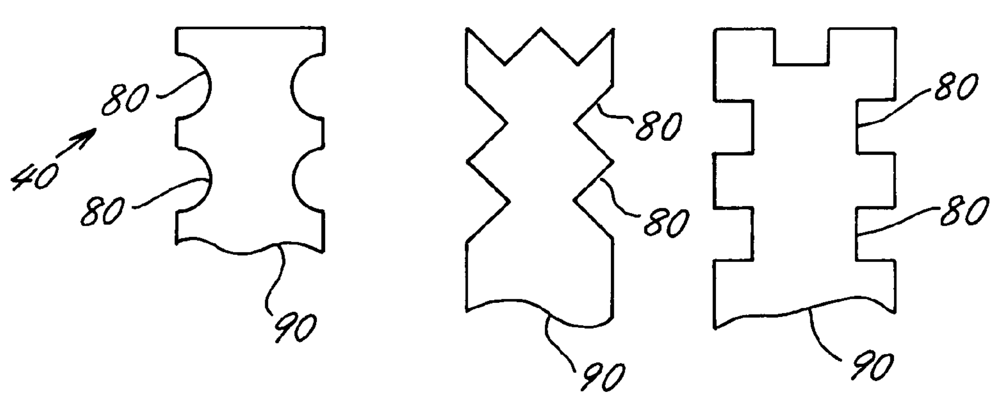

ELECTRONIC COMPONENT HAVING LEAD FRAME

FIELD OF THE INVENTION

The present invention relates to electronic components having lead frames, and more particularly to solid electrolytic capacitors.

BACKGROUND OF THE INVENTION

FIG. 10 shows the construction of a solid electrolytic capacitor 1 already known (see the publication of JP-A No. 1996-148392). The capacitor comprises a capacitor element 2 which has platelike lead frames 9, 90 attached to the periphery thereof and which is covered with a synthetic resin housing 7. The lead frames 9, 90 partly extend from the housing 7 and are bent downward along the periphery. As is already known, the housing 7 is made by placing the capacitor element 2 having the lead frames 9, 90 attached thereto into a mold (not shown) and then enclosing the element 2 with epoxy resin or like synthetic resin by injection molding.

The capacitor element 2 comprises an anode body 20 which is a sintered body of a valve metal, a dielectric oxide coating 21 formed over the periphery of the anode body 20, and a cathode layer 5 provided over the coating 21.

The cathode layer 5 comprises a solid electrolyte layer 3 and a carbon-silver paste layer 6. An anode lead 22 in the form of a pin extends from one end of the anode body 20, and the anode lead frame 9 is joined to the anode lead 22 by resistance welding. The cathode lead frame 90 is attached to the cathode layer 5 with an electrically conductive adhesive 4.

The term "valve metal" refers to a metal which forms an extremely compacted and durable dielectric oxide coating when treated by electrolytic oxidation. Examples of such metals are Al (aluminum), Ta (tantalum), Ti (titanium), Nb (niobium), etc. Further solid electrolytes include manganese dioxide and like electrically conductive inorganic materials, and polythiophene-type and polypyrrole-type electrically conductive high polymers in addition to TCNQ complex salt.

The anode lead 22 is thinner than the anode lead frame 9, exhibits a low bond strength if attached to the frame 9 with the conductive adhesive 4 and is therefore joined thereto by resistance welding. On the other hand, if the cathode lead frame 90 is joined to the capacitor element 2 by resistance welding, the cathode layer 5 to be clamped by the resistance welding electrode (not shown) is likely to become thereby damaged, so that the conductive adhesive 4 is used for the layer 5.

FIG. 11 is a perspective view showing the connection between the cathode lead frame 90 and the capacitor element 2. The conductive adhesive 4 is applied not only to the bottom face of the lead frame 90 but also to side edges thereof. An excess of adhesive 4 applied to the cathode lead frame 90 results in an increased bond strength.

In addition to being amenable to bonding with the conductive adhesive 4, the material of the lead frames 9, 90 must be diminished in surface oxidation, and needs to have mechanical characteristics such as ease of soldering.

As a material having such properties, an alloy is in use which consists mainly of Cu and contains Fe, Ni, Sn, Cr and Zr added thereto (see the publication of JP-A No. 1988-293147). Cu is lower in mechanical strength than Fe or the like and therefore given an enhanced mechanical strength by the addition of Fe and other elements.

However, the alloy is higher in coefficient of thermal expansion than the metals previously used for the lead frames 9, 90, such that the lead frame made from the alloy is liable to expand when exposed to the heat applied for making the housing 7 by injection molding. Such an alloy is of course higher than the conductive adhesive in coefficient of thermal expansion. After the solid electrolytic capacitor 1 has been fabricated, voltage of about 10 V is applied across the lead frames 9, 90 only for a specified period of time so as to pass overcurrent through a faulty portion of the dielectric oxide coating 21. The faulty portion becomes locally heated, releasing a dopant within the solid electrolyte layer therefrom to provide insulation and repair the faulty portion. This process is termed "aging." During this aging, the faulty portion of the coating 21 will rise in temperature owing to the flow of overcurrent therethrough, and the heat will be delivered to the lead frames 9, 90.

Accordingly, the thermal expansion of the lead frames 9, 90 exerts pressure, causing the conductive adhesive 4 as cured to develop cracks. The cracking will then shift the position of the lead frames 9, 90 or make the frames removable easily. The shift of the position alters the areas of contact of the lead frames 9, 90 with the capacitor element 2, consequently producing variations in ESR (equivalent series resistance). This is likely to entail a lower yield when solid electrolytic capacitors 1 are produced in large quantities.

An object of the present invention is to provide an electronic component, especially a solid electrolytic capacitor having lead frames 9, 90 which are unlikely to be shifted in position relative to an element 2 or to be removed therefrom.

SUMMARY OF THE INVENTION

The present invention provides an electronic component wherein a lead frame 90 is attached to an element 2 with an electrically conductive adhesive 4.

The lead frame 90 has an adhesive filling portion 40 at a part thereof having a lower surface opposed to the element 2, and the filling portion 40 has inside thereof filled with the conductive adhesive 4. The adhesive filling portion 40 is one of a hole 8, cavity, cutout 80 and groove 6.

Since the conductive adhesive 4 as cured fills the interior of the filling portion 40, the lead frame 90 is correctly positioned in place on the capacitor element 2. Accordingly, even if the lead frame 90 thermally expands, causing the layer of adhesive 4 to develop cracks, the lead frame 90 remains unaltered in position within a horizontal plane relative to the capacitor element 2. Consequently, the area of contact of the cathode lead frame 90 with the capacitor element 2 remains unchanged, producing no variations, for example, in ESR and resulting in a higher yield when the solid electrolytic capacitor 1 is produced in large quantities.

BRIEF DESCRIPTION OF THE DRAWINGS

FIG. 1 is a sectional view of a solid electrolytic capacitor of the invention;

FIG. 2 is a bottom view of a cathode lead frame;

FIGS. 3, (*a*), (*b*) and (*c*) are bottom views of other cathode lead frames;

FIG. 5(*b*) is a view in section taken along a plane containing the line B—B of FIG. 5(*a*);

Figure 4:
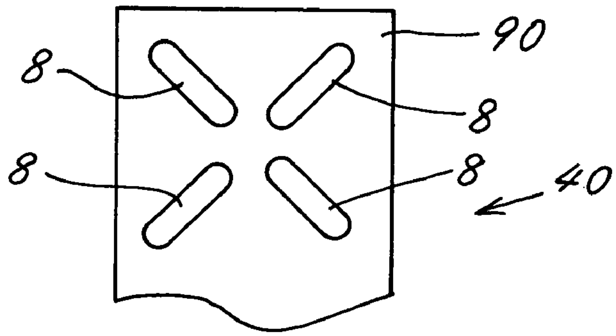
FIG. 4 is a bottom view of another cathode lead frame.

DESCRIPTION OF THE PREFERRED EMBODIMENTS (First Embodiment)

FIG. 1 is a sectional view of a solid electrolytic capacitor 1 of the invention. A capacitor element 2, which has the same structure as in the prior art, comprises an anode body 20, a dielectric oxide coating 21 formed over the periphery of the body 20 and a cathode layer 5 provided over the coating 21. The capacitor element 2 is provided with lead frames 9, 90, which are bent along the periphery of a housing 7.

The present invention is characterized in that the cathode lead frame 90 has adhesive filling portions 40 which are more specifically in the form of holes, bores or grooves and which are filled with an electrically conductive adhesive 4. As in the prior art, the cathode lead frame 90 is made from an alloy comprising Cu, and Fe and other elements which are added to the Cu. However, the material of the frame is not limited to this alloy.

FIG. 2 is a bottom view of the cathode lead frame 90, which is shown as turned through 90 degrees from the position in FIG. 1. A plurality of holes 8, up to 1 mm in diameter, are formed in the lead frame 90 and filled with the conductive adhesive 4 as shown in FIG. 1.

Even if the lead frame 90 thermally expands, causing the layer of conductive adhesive 4 to develop cracks, the lead frame 90 remains unaltered in position within a horizontal plane relative to the capacitor element 2 since the holes are filled with the adhesive 4. Consequently, the area of contact of the cathode lead frame 90 with the capacitor element 2 remains unchanged, producing no variations, for example, in ESR and resulting in an improved yield when the solid electrolytic capacitor 1 is produced in large quantities. Further there is no need to apply an excess of adhesive 4 to give an enhanced bond strength, hence a production cost reduction.

Although the holes 8 are formed in the cathode lead frame 90 according to the above embodiment, semicircular, triangular or quadrilateral cutouts 80 may alternatively be formed in the side edges of the lead frame 90 as seen in FIGS. 3, (*a*), (*b*) and (*c*) to fill the cutouts 80 with the conductive adhesive 4. The holes 8 and cutouts 80 are not limited to those illustrated in shape. The holes 8 may be in the form of slits in a radial arrangement as shown in FIG. 4. Recesses or cavities (not shown) may be provided in place of the holes 8.

(Second Embodiment)

Figure 5:
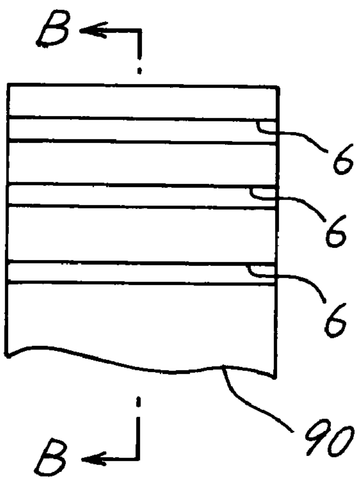
FIG. 5(*a*) is a bottom view of another cathode lead frame.
Figure 5:
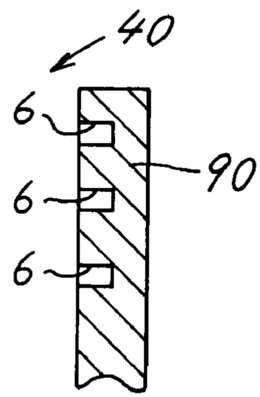

FIG. 5(*a*) is a bottom view of a cathode lead frame 90 according to this embodiment, and FIG. 5(*b*) is a view in section taken along a plane containing the line B—B of FIG. 5(*a*). A plurality of grooves 6, 6 about several tens of micrometers in depth are formed in parallel to each other in the bottom surface of the lead frame 90 widthwise thereof.

The grooves 6, 6 are filled with the conductive adhesive 4. Since the grooves 6 are filled with the adhesive 4 as cured, the lead frame 90 remains unaltered in position relative to the capacitor element 2 within a horizontal plane. This obviates variations, for example, in ESR, achieving an improved yield when the solid electrolytic capacitor 1 is produced in quantities.

Figure 6:
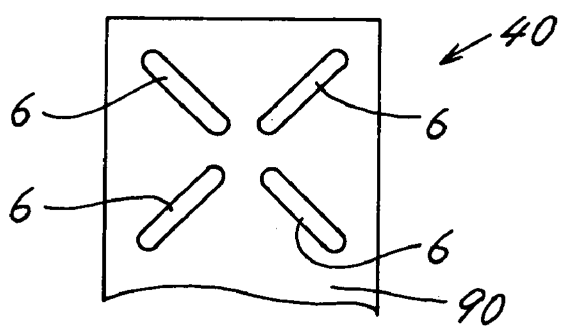
FIG. 6 is a bottom view of another cathode lead frame.

A plurality of grooves 6, 6 may be formed in a radial arrangement in the bottom surface of the lead frame 90 as shown in FIG. 6.

Figure 7:
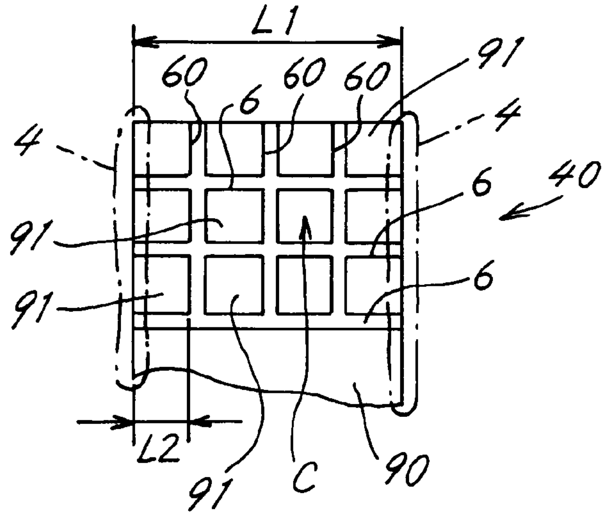
FIG. 7 is a bottom view of another cathode lead frame.

Alternatively, a plurality of grooves 6, 60 may be so formed as to intersect one another as seen in FIG. 7. These grooves include first grooves 6 parallel to the widthwise direction of the frame 90, and second grooves 60 generally orthogonal to the first grooves 6. Provision of the grooves 6, 60 in the intersecting pattern entails the following advantage.

The bottom surface of the lead frame 90 is divided into a plurality of rectangular frame segments 91 by the intersecting grooves 6, 60. For the sake of convenience of illustration, it is assumed that four frame segments 91, 91 are provided widthwise of the frame 90. The conductive adhesive 4 is applied to the bottom surface and opposite side portions of the frame 90. Suppose the lead frame 90 has a width of L1, and the frame segments 91 have a width of L2.

Figure 8:
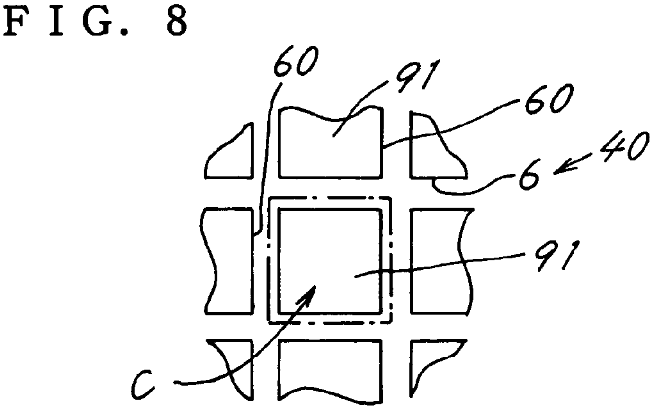
FIG. 8 is an enlarged view of the portion C in FIG. 7.

When the unit frame 91 surrounded by the grooves 6, 60 (e.g., the portion C in FIG. 7) thermally expands as indicated in a chain line in FIG. 8, the resulting expansion is positioned within the grooves 6, 60 and will not reach the conductive adhesive 4.

Further unless the grooves 6, 60 are provided, the conductive adhesive 4 applied to the bottom surface of the lead frame 90 will be drawn sideways by an amount of expansion corresponding to the widthwise dimension L1 of the lead frame 90, whereas with the lead frame 90 provided with the intersecting grooves 6, 60, the adhesive 4 applied to the bottom surface of the frame 90 is drawn sideways by an amount of expansion corresponding to the combined widthwise dimension of L2×4 of four frame segments 91. Since the widthwise dimensions have the relationship of L1>L2×4, the amount of adhesive 4 as cured and drawn sideways is smaller when the lead frame 90 is provided with the intersecting grooves 6, 60.

Further unless the grooves 6, 60 are provided, the adhesive 4 applied to the side portion of the lead frame 90 is pressed by an amount of expansion corresponding to the widthwise dimension L1 of the frame 90. On the other hand, with the lead frame 90 provided with the intersecting grooves 6, 60, the adhesive applied to the side portion of the frame 90 is pressed by an amount of expansion corresponding to the widthwise dimension L2 of the frame segment 91.

This reduces the likelihood of the adhesive 4 cracking, consequently preventing the shift of the position of the lead frame 90 within a horizontal plane and achieving a higher yield when the solid electrolytic capacitor 1 is produced in quantities.

Figure 9:
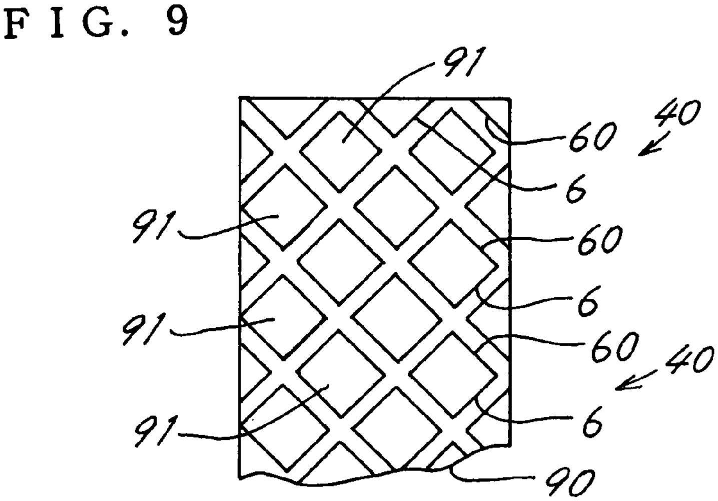
FIG. 9 is a bottom view of another cathode lead frame.
Figure 10:
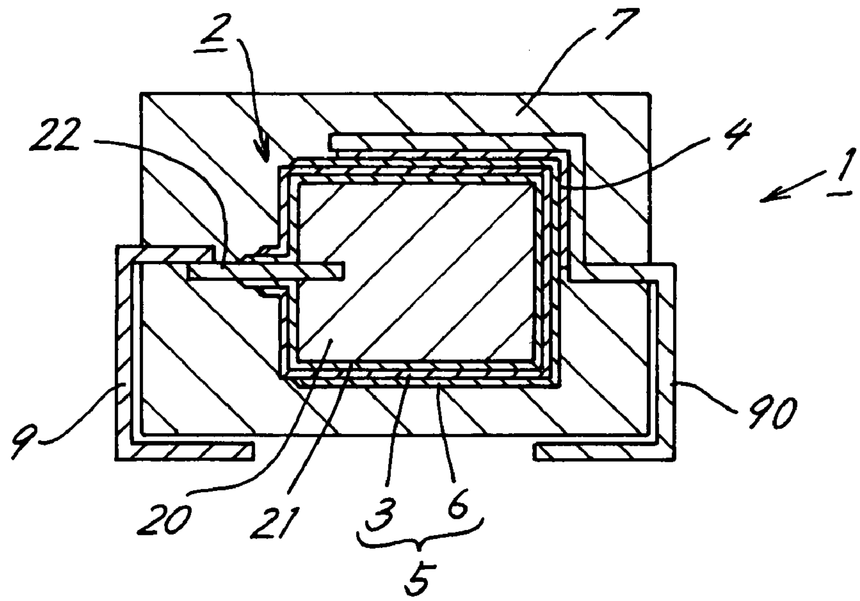
FIG. 10 is a sectional view of a conventional solid electrolytic capacitor.
Figure 11:
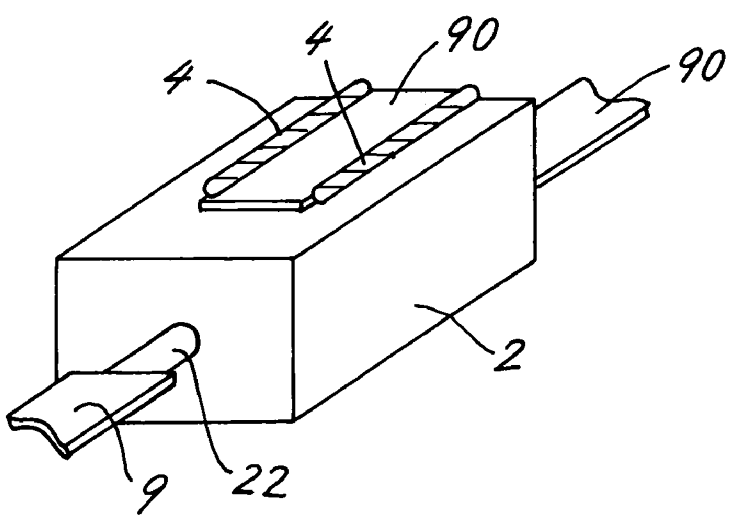
FIG. 11 is a perspective view showing the connection between a cathode lead frame of the prior art and a capacitor element thereof.

The first grooves 6 and the second grooves 60 may be formed as inclined with respect to the widthwise direction of the lead frame 90 as shown in FIG. 9.

Although the foregoing embodiments have been described with reference to the solid electrolytic capacitor as an electronic component having lead frames 9, 90, the invention may be embodied as other electronic components such as ICs. Anode leads 22 include those in the form of foil. When such an anode lead 22 is to be attached to the anode lead frame 9 with the conductive adhesive 4, holes or the like may be formed in the anode lead frame 9.

The lead frames 9, 90 become heated not only when the solid electrolytic capacitor 1 is fabricated but also when reflow soldering is performed for the solid electrolytic capacitor. The lead frames 9, 90 of the capacitor of the invention can be prevented from shifting in position also when this method of soldering is practiced.

What is claimed is:

1. An electronic component wherein a lead frame is attached to an element with an electrically conductive adhesive, the electronic component being characterized in that the lead frame has an adhesive filling portion formed at a part thereof having a lower surface opposed to the element, the filling portion having an inside thereof filled with the conductive adhesive, wherein the lead frame is provided with a plurality of grooves intersecting one another and divided into a plurality of frame segments by the grooves.

2. An electronic component according to claim 1 which is a solid electrolytic capacitor and wherein the element is a capacitor element.

3. An electronic component according to claim 2 wherein the capacitor element is covered with a synthetic resin housing.

* * * * *